US012795814B2

(12) United States Patent
Chen et al.

(10) Patent No.: US 12,795,814 B2
(45) Date of Patent: Nov. 10, 2026

(54) COPPER FOIL HAVING PATTERNED ROUGHNESS NODULES

(71) Applicant: DELL PRODUCTS L.P., Round Rock, TX (US)

(72) Inventors: Chang-Hsien Chen, New Taipei City (TW); Yi-Tang Chen, Xinzhuang (TW); Chun-Lin Liao, Taipei (TW); Bhyrav Mutnury, Round Rock, TX (US)

(73) Assignee: Dell Products L.P., Round Rock, TX (US)

( * ) Notice: Subject to any disclaimer, the term of this patent is extended or adjusted under 35 U.S.C. 154(b) by 205 days.

(21) Appl. No.: 18/775,957

(22) Filed: Jul. 17, 2024

(65) Prior Publication Data

US 2026/0025909 A1 Jan. 22, 2026

(51) Int. Cl.
*H05K 1/02* (2006.01)
*H05K 3/38* (2006.01)

(52) U.S. Cl.
CPC ........... *H05K 1/0242* (2013.01); *H05K 3/382* (2013.01); *H05K 2201/0929* (2013.01); *H05K 2203/0307* (2013.01)

(58) Field of Classification Search
CPC ................. H05K 1/0242; H05K 3/382; H05K 2201/0929; H05K 2203/0307
See application file for complete search history.

(56) References Cited

U.S. PATENT DOCUMENTS

| | | | | |
|---|---|---|---|---|
| 6,596,384 | B1 | 7/2003 | Day et al. | |
| 2004/0007313 | A1* | 1/2004 | Day ....................... | H05K 3/382 430/313 |
| 2025/0113442 | A1* | 4/2025 | Kim ........................ | B32B 15/20 |

* cited by examiner

*Primary Examiner* — Jeremy C Norris
(74) *Attorney, Agent, or Firm* — Larson Newman, LLP

(57) ABSTRACT

Copper foil to provide electrical conductivity includes a flexible conductive surface on which multiple roughness nodules are formed, arranged according to a predetermined pattern. One or more channels extend between a pair of rows of the roughness nodules, each channel provides a conduction path.

20 Claims, 9 Drawing Sheets

COPPER FOIL HAVING PATTERNED ROUGHNESS NODULES

FIELD OF THE DISCLOSURE

The present disclosure generally relates to information handling systems, and more particularly relates to copper foil used in information handling systems as well as other electronic devices.

BACKGROUND

As the value and use of information continues to increase, individuals and businesses seek additional ways to process and store information. One option is an information handling system. An information handling system generally processes, compiles, stores, or communicates information or data for business, personal, or other purposes. Technology and information handling needs and requirements can vary between different applications. Thus, information handling systems can also vary regarding what information is handled, how the information is handled, how much information is processed, stored, or communicated, and how quickly and efficiently the information can be processed, stored, or communicated. The variations in information handling systems allow information handling systems to be general or configured for a specific user or specific use such as financial transaction processing, airline reservations, enterprise data storage, or global communications. In addition, information handling systems can include a variety of hardware and software resources that can be configured to process, store, and communicate information and can include one or more computer systems, graphics interface systems, data storage systems, networking systems, and mobile communication systems. Information handling systems can also implement various virtualized architectures. Data and voice communications among information handling systems may be via networks that are wired, wireless, or some combination.

SUMMARY

Copper foil to provide electrical conductivity includes a flexible conductive surface on which multiple roughness nodules are formed, arranged according to a predetermined pattern. One or more channels extend between a pair of rows of the roughness nodules, each channel providing a conduction path.

BRIEF DESCRIPTION OF THE DRAWINGS

It will be appreciated that for simplicity and clarity of illustration, elements illustrated in the Figures are not necessarily drawn to scale. For example, the dimensions of some elements may be exaggerated relative to other elements. Embodiments incorporating teachings of the present disclosure are shown and described with respect to the drawings herein, in which.

The use of the same reference symbols in different drawings indicates similar or identical items.

DETAILED DESCRIPTION OF THE DRAWINGS

The following description in combination with the Figures is provided to assist in understanding the teachings disclosed herein. The description is focused on specific implementations and embodiments of the teachings and is provided to assist in describing the teachings. This focus should not be interpreted as a limitation on the scope or applicability of the teachings.

Figure 1:
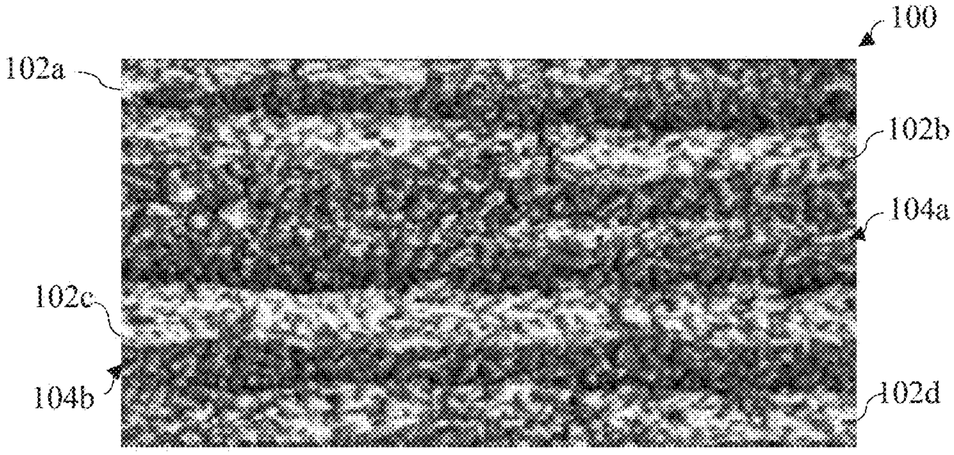
FIG. 1 is an image of a section of copper foil having channels formed by patterns of roughness nodules according to at least one embodiment of the present disclosure.

FIG. 1 illustrates copper foil 100 having an arranged pattern roughness nodules and channels, the channels providing distinct conduction paths. Illustratively, the roughness nodules are arranged in a pattern of rows of roughness nodules 102*a*, 102*b*, 102*c*, and 102*d* are formed on a flexible conductive surface of foil 100, the rows creating multiple channels 104*a* and 104*b* that serve as electrical conduction paths, according to at least one embodiment of the present disclosure. Channels 104*a* and 104*b* between respective pairs of the rows of roughness nodules 102*b* and 102*c* and 102*c* and 102*d* may be smoothed substantially relative to the roughness nodules to provide enhanced conduction paths and mitigate channel loss. Copper foil is widely used in the construction of computer chips, integrated circuits, and printed circuit boards for information handling systems and other electronic devices. Different patterns of roughness nodules 200, 300, 400, 500, 600, and 700 described herein can be selected and used to meet the specific circuitry requirements of various electronic devices, including information handling system 900 of FIG. 9.

For purposes of this disclosure, an information handling system can include any instrumentality or aggregate of instrumentalities operable to compute, calculate, determine, classify, process, transmit, receive, retrieve, originate, switch, store, display, communicate, manifest, detect, record, reproduce, handle, or utilize any form of information, intelligence, or data for business, scientific, control, or other purposes. For example, an information handling system may be a personal computer (such as a desktop or laptop), tablet computer, mobile device (such as a personal digital assistant (PDA) or smart phone), server (such as a blade server or rack server), a network storage device, or any other suitable device and may vary in size, shape, performance, functionality, and price. The information handling system may include random access memory (RAM), one or more processing resources such as a central processing unit (CPU) or hardware or software control logic, ROM, and/or other types of nonvolatile memory. Additional components of the information handling system may include one or more disk drives, one or more network ports for communicating with external devices as well as various input and output (I/O) devices, such as a keyboard, a mouse, touchscreen and/or a video display. The information handling system may also include one or more buses operable to transmit communications between the various hardware components.

Figure 2:
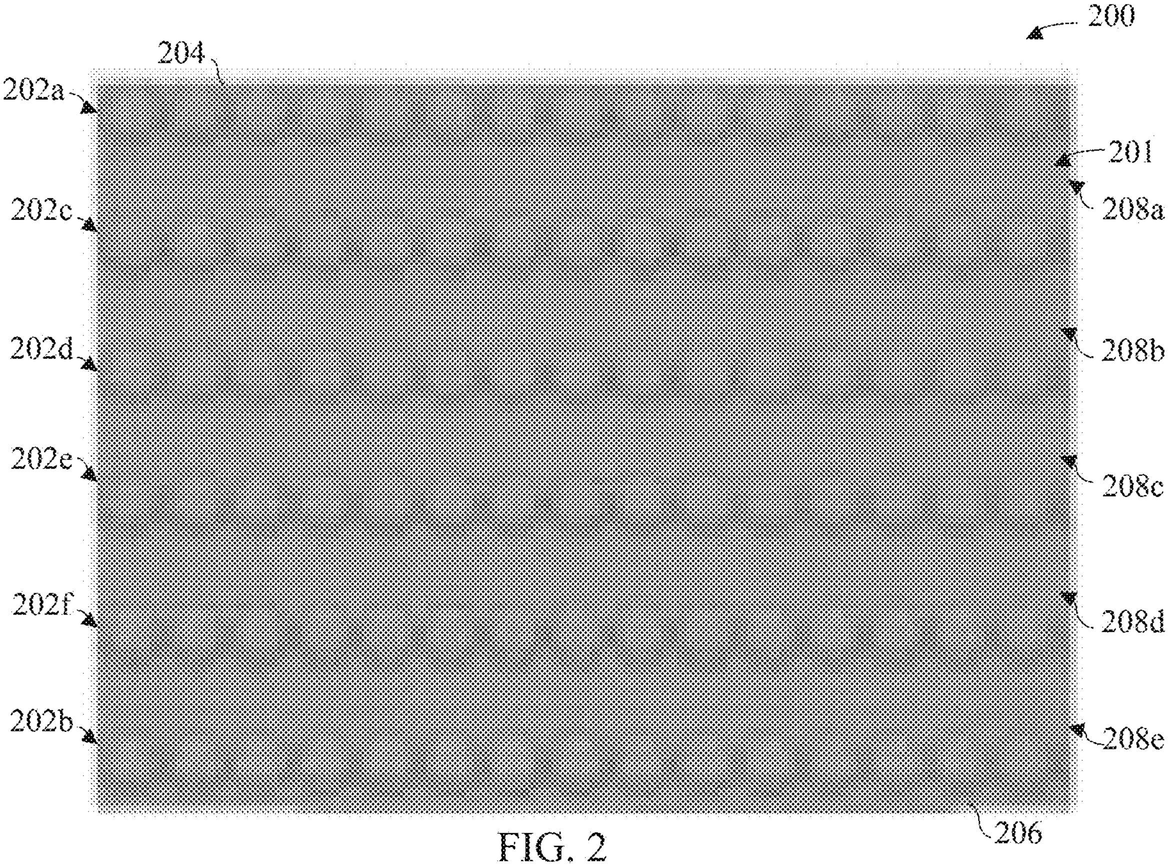
FIG. 2 is a diagram of a copper foil having a flexible conductive surface on which multiple rows of roughness nodules are patterned in creating one or more channels that provide conduction paths according to an embodiment of the of the present disclosure.

FIG. 2 illustrates copper foil 200 having flexible conductive surface 200 according to an embodiment of the present disclosure. As illustrated, formed on flexible conductive surface 201 is a pair of edgewise rows of roughness nodules 202*a* and 202*b*. One of the pair of rows, row of roughness nodules 202*a*, extends along edge 204 of flexible conductive surface 201, and the other, row of roughness nodules 202*b*, extends along opposing edge 206 of the flexible conductive surface. Multiple rows of roughness nodules 202*c*, 202*d*, 202*e*, and 202*f* are equally spaced-apart from one another on flexible conductive surface 201 of copper foil 200 between the pair of edgewise rows 202*a* and 202*b*. Each of channels 208*a*, 208*b*, 208*c*, 208*d*, and 208*e* are located in separate regions of flexible conductive surface 201 between respective pairs of the rows of the roughness nodules. Channels 208*a*, 208*b*, 208*c*, 208*d*, and 208*e* provide conduction paths for signals across copper foil 200.

Figure 3:
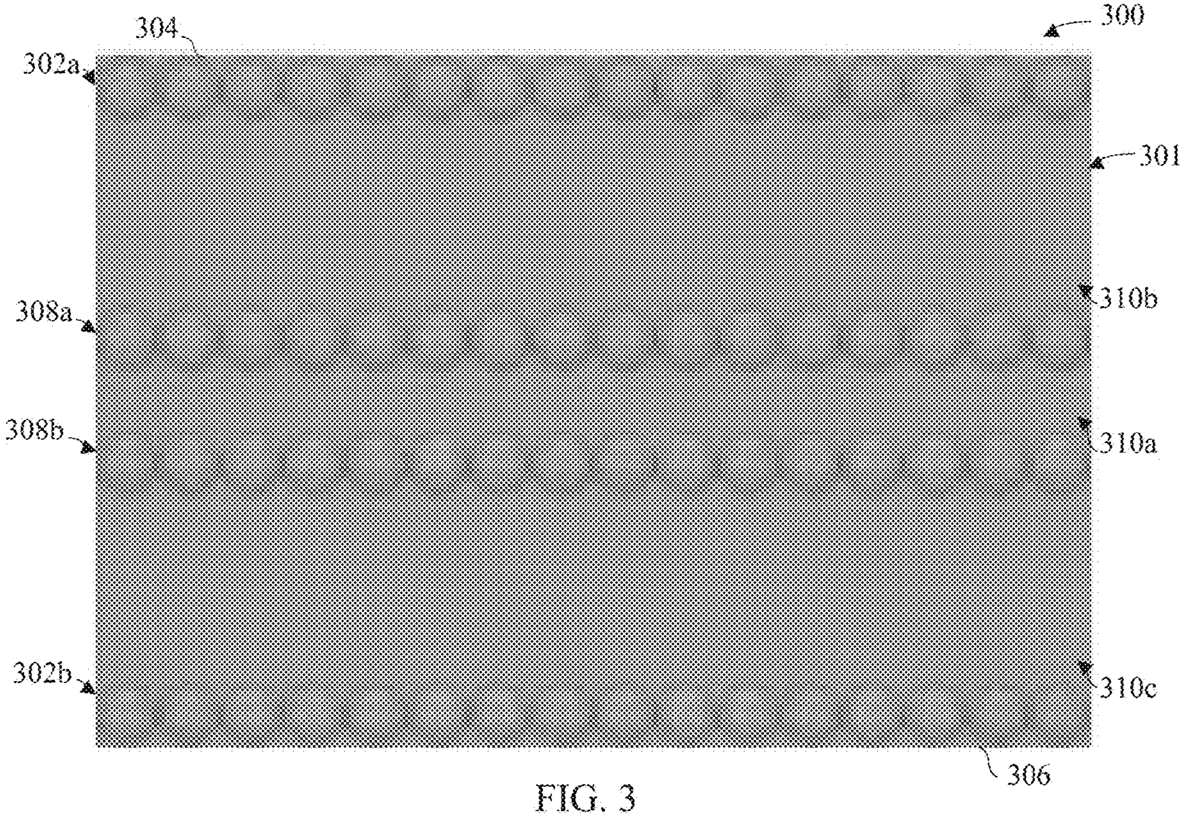
FIG. 3 is a diagram of a copper foil having a flexible conductive surface on which multiple rows of roughness nodules are patterned in creating one or more channels that provide conduction paths according to another embodiment of the of the present disclosure.

FIG. 3 illustrates copper foil 300 having flexible conductive surface 301 according to another embodiment of the present disclosure. As shown, a pattern of roughness nodules includes a pair of edgewise rows of roughness nodules 302*a* and 302*b* formed in flexible conductive surface 301. One of the pair of rows, such as row of roughness nodules 302*a*, extends along edge 304 of flexible conductive surface 301. The other, row of roughness nodules 302*b*, extends along opposing edge 306 of flexible conductive surface 301. A pair of parallel rows of roughness nodules 308*a* and 308*b* are substantially centered on flexible conducive surface 301 between the pair of edgewise rows of roughness nodules 302*a* and 302*b*. Multiple channels 310*a*, 310*b*, and 310*c* are located in separate regions of the flexible conductive surface 301 between respective pairs of rows of the roughness nodules and provide distinct conduction paths for signals on copper foil 300.

Figure 4:
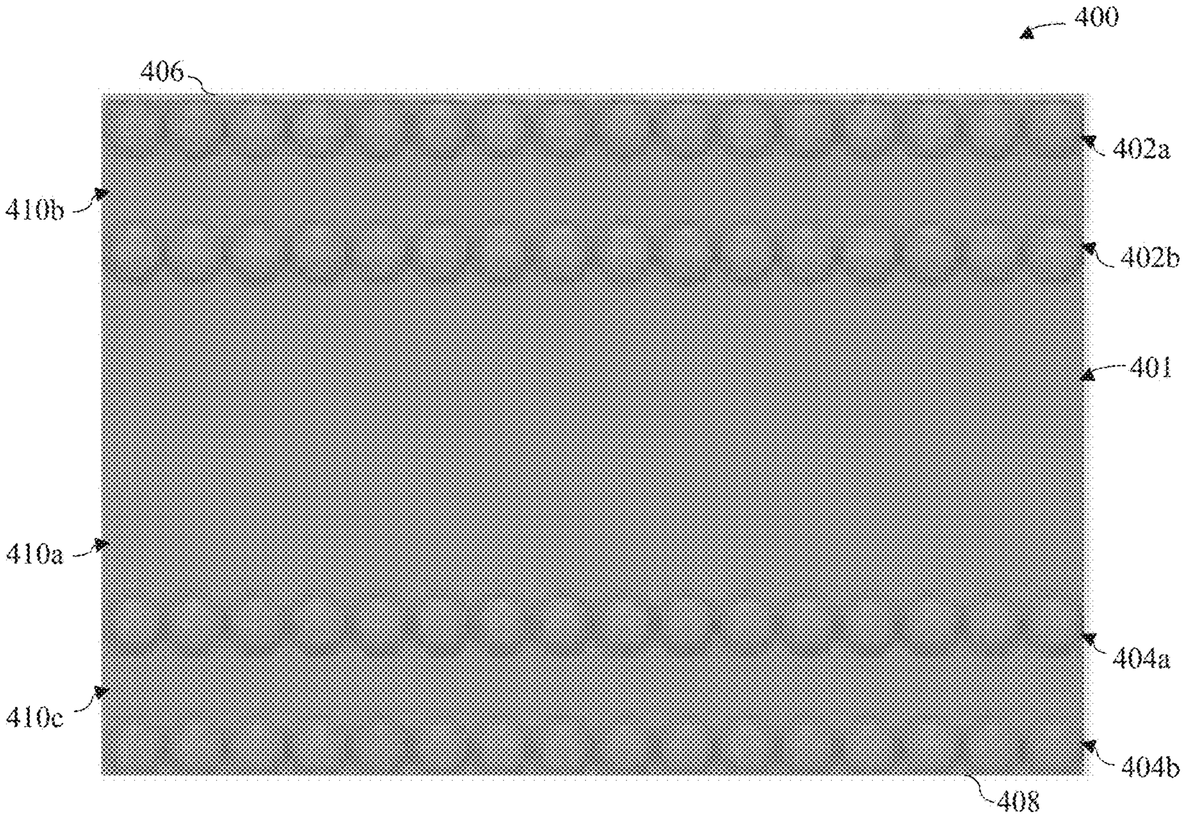
FIG. 4 is a diagram of a copper foil having a flexible conductive surface on which multiple rows of roughness nodules are patterned in creating one or more channels that provide conduction paths according to yet another embodiment of the of the present disclosure.

FIG. 4 illustrates copper foil 400 having flexible conductive surface 401 according to yet another embodiment of the present disclosure. As illustrated, a first pair spaced-apart rows of roughness nodules 402*a* and 402*b* and a second pair of spaced-apart rows of roughness nodules 404*a* and 40*b* are formed on flexible conductive surface 401. The first pair of spaced-apart rows of roughness nodules 402*a* and 402*b* extend along edge 406 of flexible conductive surface 401, and the second pair of spaced-apart rows of roughness nodules 404*a* and 404*b* extends along opposing edge 408 of the flexible conductive surface. Channels 410*a*, 410*b*, and 410*c* are located in separate regions of flexible conductive surface 401 between respective pairs of rows of the roughness nodules.

Figure 5:
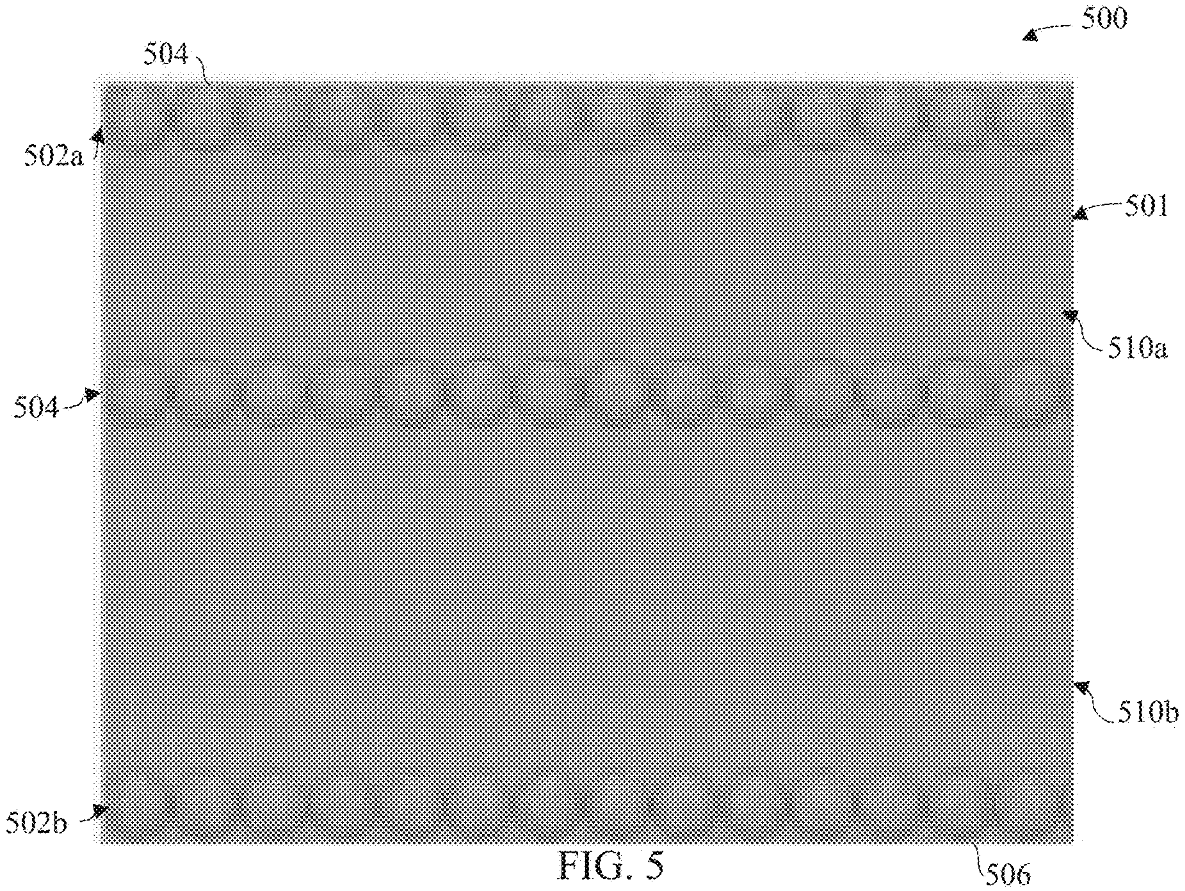
FIG. 5 is a diagram of a copper foil having a flexible conductive surface on which multiple rows of roughness nodules are patterned in creating one or more channels that provide conduction paths according to still another embodiment of the of the present disclosure.

FIG. 5 illustrates copper foil 500 having flexible conductive surface 501 according to still another embodiment of the present disclosure. As shown, a predetermined pattern of roughness nodules includes a pair of edgewise rows of roughness nodules 502*a* and 502*b* formed along opposing sides 504 and 506 of flexible conductive surface 501. An off-centered row of roughness nodules 508 is located closer to row of roughness nodules 502*a* than to row of roughness nodules 502*b*. Channels 510*a* and 510*b* lie between the respective rows of roughness nodules and provide separate conduction paths along copper foil 500.

Figure 6:
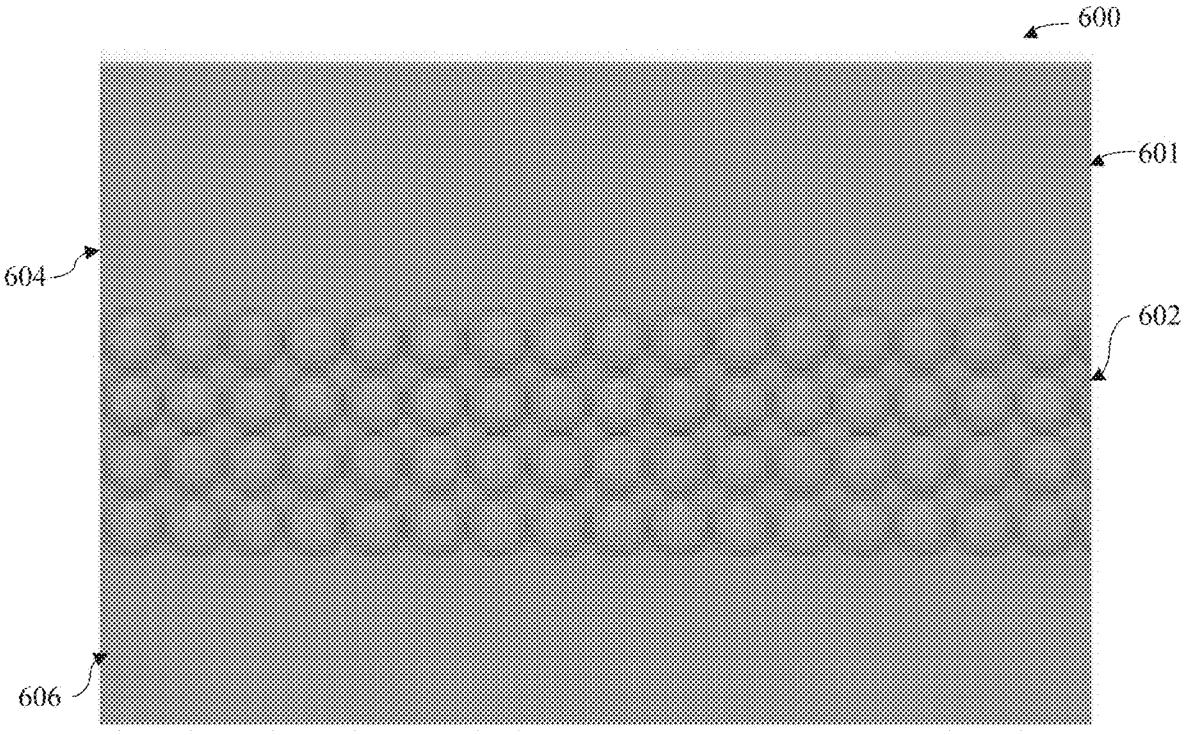
FIG. 6 is a diagram of a copper foil having a flexible conductive surface on which multiple rows of roughness nodules are patterned in creating one or more channels that provide conduction paths according to yet another embodiment of the of the present disclosure.

FIG. 6 illustrates copper foil 600 having flexible conductive surface 601 according to yet another embodiment of the present disclosure. As illustrated, a predetermined pattern of roughness nodules includes a group of closely aligned rows of roughness nodules 602 substantially centered on flexible conductive surface 601. Channel 604 is located in a region of flexible conductive surface 601 on one side of closely aligned rows of roughness nodules 602, and channel 606 is located on the opposite side of the closely aligned rows, both providing distinct conduction paths on copper foil 600.

Figure 7:
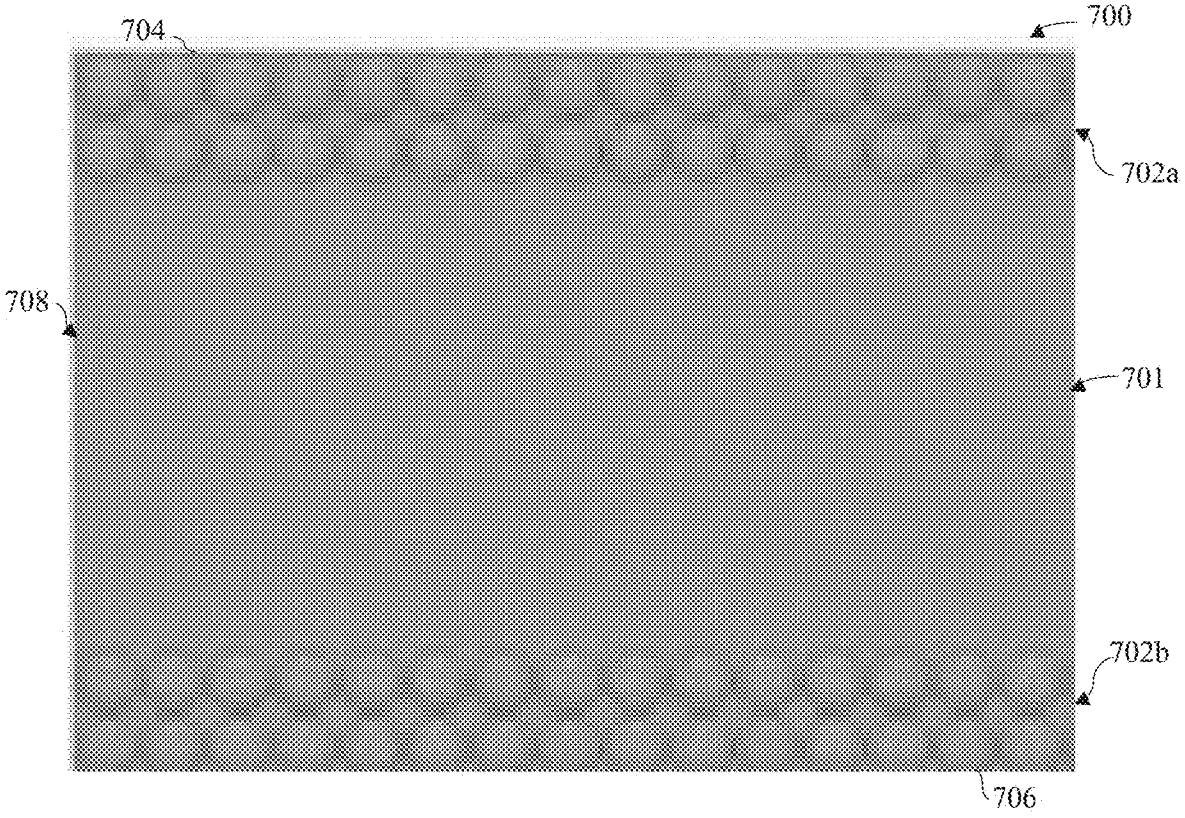
FIG. 7 is diagram of a copper foil having a flexible conductive surface on which multiple rows of roughness nodules are patterned in creating one or more channels that provide conduction paths according to still another embodiment of the of the present disclosure.

FIG. 7 illustrates copper foil 700 having flexible conductive surface 701 according to still another embodiment of the present disclosure. Illustratively, in accordance with a predetermined pattern of roughness nodules, a first pair of closely aligned rows of roughness nodules 702*a* extends along edge 704 of flexible conductive surface 701. A second pair of closely aligned rows of roughness nodules 702*b* extends along opposing edge 706 of flexible conductive surface 701. Channel 708 is located in a region of flexible conductive surface 701 between the first and second pairs of closely aligned rows of roughness nodules 702*a* and 702*b*, providing a single conduction path of copper foil 700.

Figure 8:
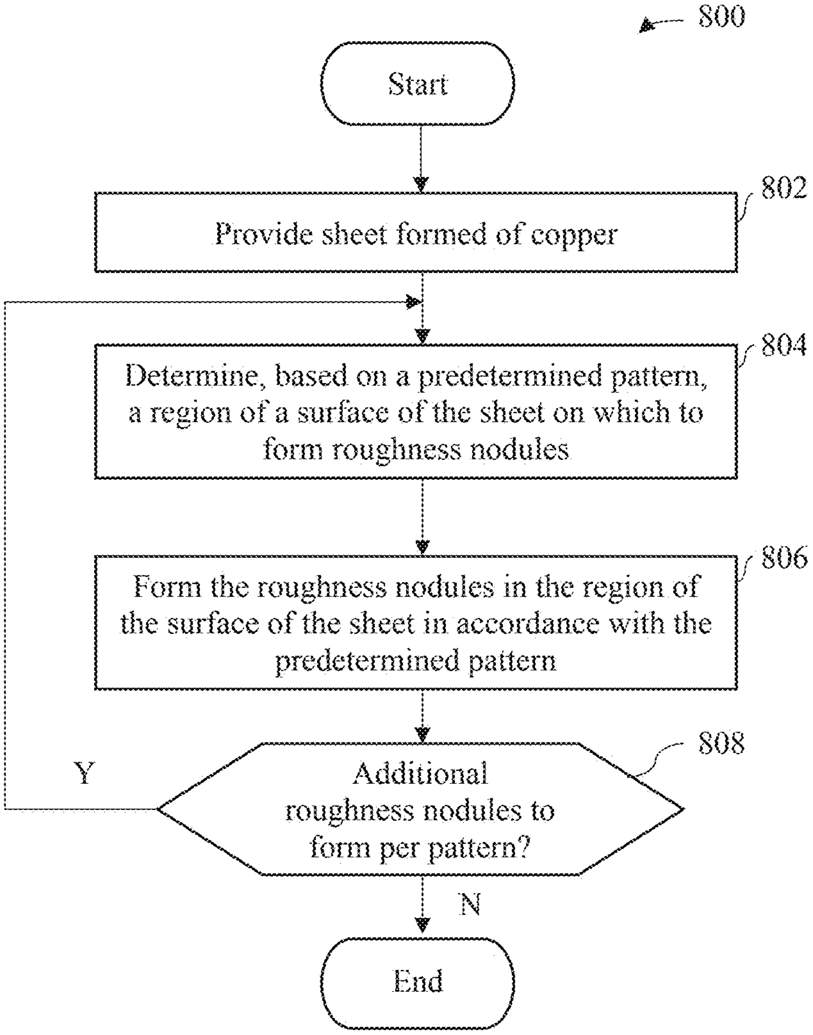
FIG. 8 is a flow diagram of method of generating copper foil having at least one channel formed by a pattern of roughness nodules according to at least one embodiment of the present invention.

FIG. 8 is a flow diagram of method 800 for producing copper foil having a surface that includes a predetermined pattern of roughness nodules according to at least one embodiment of the present disclosure, starting at step 802. It will be readily appreciated that not every method step set forth in this flow diagram is always necessary, and that certain steps of the methods may be combined, performed simultaneously, in a different order, or perhaps omitted, without varying from the scope of the disclosure. Method 800 may be utilized to produce copper foil having the patterns of roughness nodules described in connection with FIGS. 1 through 7.

At step 802, a sheet formed of copper is provided. The sheet may be a flexible sheet of electrolytic copper foil that is produced, for example, by the known process of electrodeposition. At step 804, a region of the surface of the sheet is determined in accordance with a predetermined pattern, the region identifiable as one on which to form multiple roughness nodules. At step 806, roughness nodules are formed on the region of the surface of the sheet determined in accordance with the predetermined pattern. Steps 804 and 806 may be repeated until the determination is made at step 808 that no additional roughness nodules need be formed in creating the predetermined pattern of roughness nodules.

In accordance with the predetermined arrangement, roughness nodules may be arranged in a formation to create one or more channels. Each channel created can provide a conductive path that is located between a pair of rows of roughness nodules formed on the surface of the sheet. In certain arrangements, the roughness nodules may be formed by electrodeposition. In alternative arrangements other methods for forming roughness nodules on the surface may be used, such as uniformly forming roughness nodules on the sheet and then etching portions of the roughened surface leaving one or more channels disposed by a pair of rows of roughness nodules arranged according to the predetermined pattern.

Figure 9:
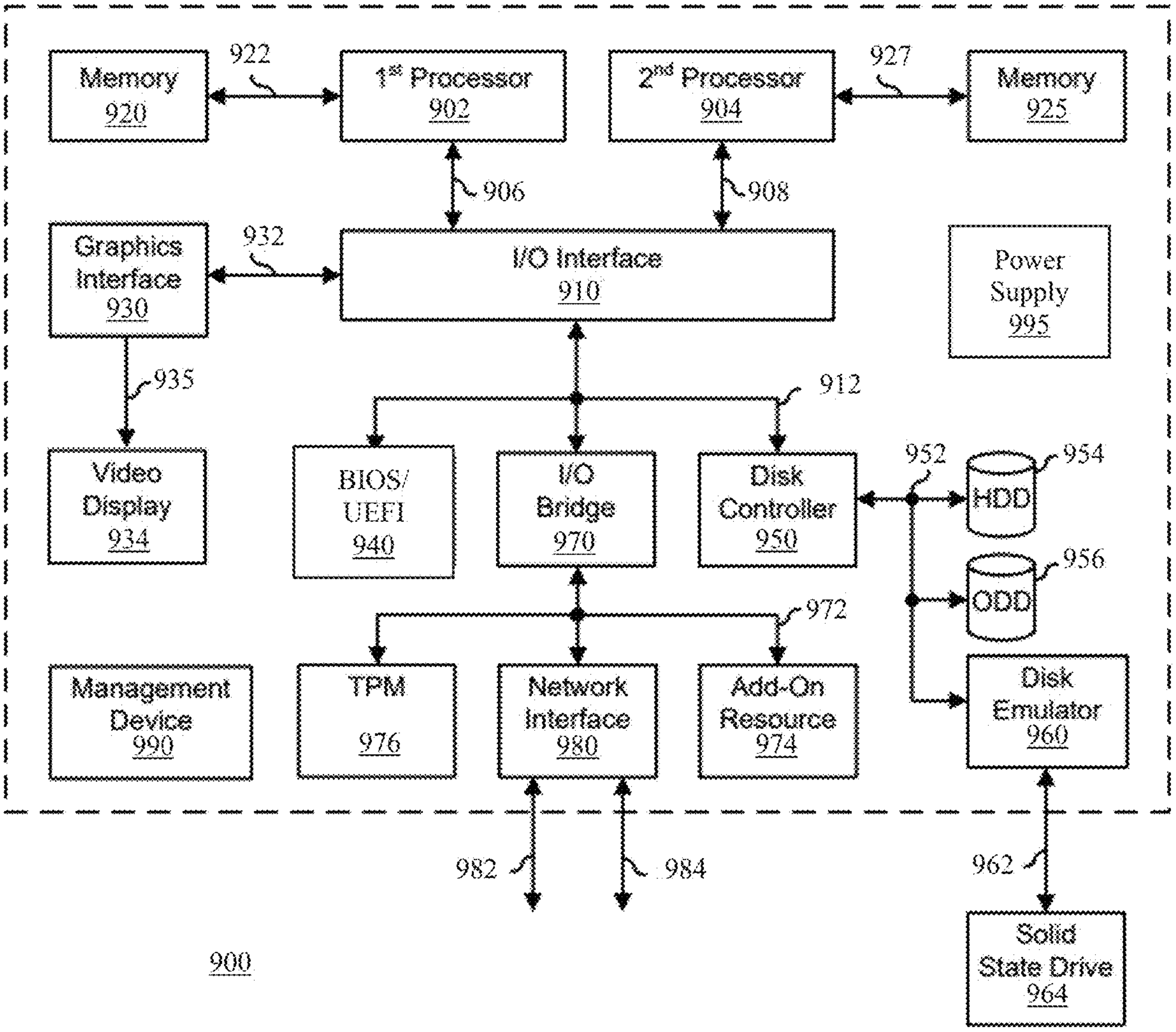
FIG. 9 is a block diagram of a general information handling system according to an embodiment of the present disclosure.

FIG. 9 shows a generalized embodiment of an information handling system 900 according to an embodiment of the present disclosure. Information handling system 900 may be substantially similar to portable information handling system 100 of FIG. 1. For purpose of this disclosure an information handling system can include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, entertainment, or other purposes. For example, information handling system 900 can be a personal computer, a laptop computer, a smart phone, a tablet device or other consumer electronic device, a network server, a network storage device, a switch router or other network communication device, or any other suitable device and may vary in size, shape, performance, functionality, and price. Further, information handling system 900 can include processing resources for executing machine-executable code, such as a central processing unit (CPU), a programmable logic array (PLA), an embedded device such as a System-on-a-Chip (SoC), or other control logic hardware. Information handling system 900 can also include one or more computer-readable mediums for storing machine-executable code, such as software or data. Additional components of information handling system 900 can include one or more storage devices that can store machine-executable code, one or more communications ports for communicating with external devices, and various input and output (I/O) devices, such as a keyboard, a mouse, and a video display. Information handling system 900 can also include one or more buses operable to transmit information between the various hardware components.

Information handling system 900 can include devices or modules that embody one or more of the devices or modules described below and operates to perform one or more of the methods described below. Information handling system 900 includes a processors 902 and 904, an input/output (I/O) interface 910, memories 920 and 925, a graphics interface 930, a basic input and output system/universal extensible firmware interface (BIOS/UEFI) module 940, a disk controller 950, a hard disk drive (HDD) 954, an optical disk drive (ODD) 956, a disk emulator 960 connected to an external solid state drive (SSD) 964, an I/O bridge 970, one or more add-on resources 974, a trusted platform module (TPM) 976, a network interface 980, a management device 990, and a power supply 995. Processors 902 and 904, I/O interface 910, memory 920, graphics interface 930, BIOS/UEFI module 940, disk controller 950, HDD 954, ODD 956, disk emulator 960, SSD 964, I/O bridge 970, add-on resources 974, TPM 976, and network interface 980 operate together to provide a host environment of information handling system 900 that operates to provide the data processing functionality of the information handling system. The host environment operates to execute machine-executable code, including platform BIOS/UEFI code, device firmware, operating system code, applications, programs, and the like, to perform the data processing tasks associated with information handling system 900.

In the host environment, processor 902 is connected to I/O interface 910 via processor interface 906, and processor 904 is connected to the I/O interface via processor interface 908. Memory 920 is connected to processor 902 via a memory interface 922. Memory 925 is connected to processor 904 via a memory interface 927. Graphics interface 930 is connected to I/O interface 910 via a graphics interface 932 and provides a video display output 936 to a video display 934. In a particular embodiment, information handling system 900 includes separate memories that are dedicated to each of processors 902 and 904 via separate memory interfaces. An example of memories 920 and 930 include random access memory (RAM) such as static RAM (SRAM), dynamic RAM (DRAM), non-volatile RAM (NV-RAM), or the like, read only memory (ROM), another type of memory, or a combination thereof.

BIOS/UEFI module 940, disk controller 950, and I/O bridge 970 are connected to I/O interface 910 via an I/O channel 912. An example of I/O channel 912 includes a Peripheral Component Interconnect (PCI) interface, a PCI-Extended (PCI-X) interface, a high-speed PCI-Express (PCIe) interface, another industry standard or proprietary communication interface, or a combination thereof. I/O interface 910 can also include one or more other I/O interfaces, including an Industry Standard Architecture (ISA) interface, a Small Computer Serial Interface (SCSI) interface, an Inter-Integrated Circuit ($I^2C$) interface, a System Packet Interface (SPI), a Universal Serial Bus (USB), another interface, or a combination thereof. BIOS/UEFI module 940 includes BIOS/UEFI code operable to detect resources within information handling system 900, to provide drivers for the resources, initialize the resources, and access the resources. BIOS/UEFI module 940 includes code that operates to detect resources within information handling system 900, to provide drivers for the resources, to initialize the resources, and to access the resources.

Disk controller 950 includes a disk interface 952 that connects the disk controller to HDD 954, to ODD 956, and to disk emulator 960. An example of disk interface 952 includes an Integrated Drive Electronics (IDE) interface, an Advanced Technology Attachment (ATA) such as a parallel ATA (PATA) interface or a serial ATA (SATA) interface, a SCSI interface, a USB interface, a proprietary interface, or a combination thereof. Disk emulator 960 permits SSD 964 to be connected to information handling system 900 via an external interface 962. An example of external interface 962 includes a USB interface, an IEEE 4394 (Firewire) interface, a proprietary interface, or a combination thereof. Alternatively, solid-state drive 964 can be disposed within information handling system 900.

I/O bridge 970 includes a peripheral interface 972 that connects the I/O bridge to add-on resource 974, to TPM 976, and to network interface 980. Peripheral interface 972 can be the same type of interface as I/O channel 912 or can be a different type of interface. As such, I/O bridge 970 extends the capacity of I/O channel 912 when peripheral interface 972 and the I/O channel are of the same type, and the I/O bridge translates information from a format suitable to the I/O channel to a format suitable to the peripheral channel 972 when they are of a different type. Add-on resource 974 can include a data storage system, an additional graphics interface, a network interface card (NIC), a sound/video processing card, another add-on resource, or a combination thereof. Add-on resource 974 can be on a main circuit board, on separate circuit board or add-in card disposed within information handling system 900, a device that is external to the information handling system, or a combination thereof.

Network interface 980 represents a NIC disposed within information handling system 900, on a main circuit board of the information handling system, integrated onto another component such as I/O interface 910, in another suitable location, or a combination thereof. Network interface device 980 includes network channels 982 and 984 that provide interfaces to devices that are external to information handling system 900. In a particular embodiment, network channels 982 and 984 are of a different type than peripheral channel 972 and network interface 980 translates information from a format suitable to the peripheral channel to a format suitable to external devices. An example of network channels 982 and 984 includes InfiniBand channels, Fiber Channel channels, Gigabit Ethernet channels, proprietary channel architectures, or a combination thereof. Network channels 982 and 984 can be connected to external network resources (not illustrated). The network resource can include another information handling system, a data storage system, another network, a grid management system, another suitable resource, or a combination thereof.

Management device 990 represents one or more processing devices, such as a dedicated baseboard management controller (BMC) System-on-a-Chip (SoC) device, one or more associated memory devices, one or more network interface devices, a complex programmable logic device (CPLD), and the like, which operate together to provide the management environment for information handling system 900. In particular, management device 990 is connected to various components of the host environment via various internal communication interfaces, such as a Low Pin Count (LPC) interface, an Inter-Integrated-Circuit (I2C) interface, a PCIe interface, or the like, to provide an out-of-band (OOB) mechanism to retrieve information related to the operation of the host environment, to provide BIOS/UEFI or system firmware updates, to manage non-processing components of information handling system 900, such as system cooling fans and power supplies. Management device 990 can include a network connection to an external management system, and the management device can communicate with the management system to report status information for information handling system 900, to receive BIOS/UEFI or system firmware updates, or to perform other task for managing and controlling the operation of information handling system 900.

Management device 990 can operate off of a separate power plane from the components of the host environment so that the management device receives power to manage information handling system 900 when the information handling system is otherwise shut down. An example of management device 990 include a commercially available BMC product or other device that operates in accordance with an Intelligent Platform Management Initiative (IPMI) specification, a Web Services Management (WSMan) interface, a Redfish Application Programming Interface (API), another Distributed Management Task Force (DMTF), or other management standard, and can include an Integrated Dell Remote Access Controller (iDRAC), an Embedded Controller (EC), or the like. Management device 990 may further include associated memory devices, logic devices, security devices, or the like, as needed, or desired.

Although only a few exemplary embodiments have been described in detail herein, those skilled in the art will readily appreciate that many modifications are possible in the exemplary embodiments without materially departing from the novel teachings and advantages of the embodiments of the present disclosure. Accordingly, all such modifications are intended to be included within the scope of the embodiments of the present disclosure as defined in the following claims. In the claims, means-plus-function clauses are intended to cover the structures described herein as performing the recited function and not only structural equivalents, but also equivalent structures.

What is claimed is:

1. A copper foil to provide electrical conductivity, the copper foil comprising:
- a flexible conductive surface, wherein the flexible conductive surface is formed from copper;
- a plurality of roughness nodules, wherein the roughness nodules are formed and arranged in a predetermined pattern of rows on the flexible conductive surface; and
- at least one channel located between a pair of parallel rows of roughness nodules, the at least one channel providing a conduction path along the copper foil.

2. The copper foil of claim 1, wherein the plurality of roughness nodules includes:
- a pair of edgewise rows of roughness nodules, wherein one of the pair of rows extends along an edge of the flexible conductive surface and the other extends along an opposing edge of the flexible conductive surface; and
- a plurality of spaced-apart rows of roughness nodules equally spaced apart from one another on the flexible conductive surface between the pair of edgewise rows,
- wherein the at least one channel comprises a plurality of channels, each channel is located in a corresponding separate region of the flexible conductive surface between respective rows of the roughness nodules.

3. The copper foil of claim 1, wherein the plurality of roughness nodules includes:
- a pair of edgewise rows of roughness nodules, wherein one of the pair of rows extends along an edge of the flexible conductive surface and the other extends along an opposing edge of the flexible conductive surface; and
- a pair of parallel rows of roughness nodules substantially centered on the flexible conducive surface between the pair of edgewise rows,
- wherein the at least one channel comprises a plurality of channels, each channel is located in a corresponding separate region of the flexible conductive surface between respective rows of the roughness nodules.

4. The copper foil of claim 1, wherein the plurality of roughness nodules includes:
- first and second pairs of spaced-apart rows of roughness nodules, wherein the first pair of spaced-apart rows extends along an edge of the flexible conductive surface and the second pair extends along an opposing edge of the flexible conductive surface,
- wherein the at least one channel comprises a plurality of channels, each channel is located in a corresponding separate region of the flexible conductive surface between respective pairs of rows of roughness nodules.

5. The copper foil of claim 1, wherein the plurality of roughness nodules includes:
- a pair of edgewise rows of roughness nodules, wherein one of the pair of rows extends along an edge of the flexible conductive surface and the other extends along an opposing edge of the flexible conductive surface; and
- an off-centered row of roughness nodules between the pair of edgewise rows,
- wherein the at least one channel comprises a plurality of channels, each channel is located in a corresponding separate region of the flexible conductive surface between respective rows of the roughness nodules.

6. The copper foil of claim 1, wherein the plurality of roughness nodules includes:

a plurality of closely aligned rows of roughness nodules substantially centered on the flexible conductive surface, wherein the at least one channel comprises a first channel located in a first region of the flexible conductive surface on a first side of the closely aligned rows of roughness nodules and a second channel in a second region of the flexible conductive surface on a second side of the closely aligned rows of roughness.

7. The copper foil of claim 1, wherein the plurality of roughness nodules includes:

a first pair of closely aligned rows of roughness nodules extending along an edge of the flexible conductive surface; and a second pair of closely aligned rows of roughness nodules extending along an opposing edge of the flexible conductive surface, wherein the at least one channel comprises a single channel located in a region of the flexible conductive surface between the first and second pairs of closely aligned rows of roughness nodules.

8. An information handling system (IHS) comprising:

a central processing unit (CPU); and random access memory (RAM) communicatively coupled with the CPU;

wherein the CPU and RAM are communicatively coupled using a circuit structure constructed with cooper foil that includes:

a flexible conductive surface, wherein the flexible conductive surface is formed from copper;

a plurality of roughness nodules, wherein the roughness nodules are formed and arranged in a predetermined pattern of rows on the flexible conductive surface; and at least one channel extending between a pair of parallel rows of roughness nodules, the at least one channel providing a conduction path.

9. The IHS of claim 8, wherein the plurality of roughness nodules includes:

a pair of edgewise rows of roughness nodules, wherein one of the pair of rows extends along an edge of the flexible conductive surface and the other extends along an opposing edge of the flexible conductive surface; and a plurality of rows of roughness nodules equally spaced-apart from one another on the flexible conductive surface between the pair of edgewise rows, wherein the at least one channel comprises a plurality of channels, each channel is located in a corresponding separate region of the flexible conductive surface between rows of the roughness nodules.

10. The IHS of claim 8, wherein the plurality of roughness nodules includes:

a pair of edgewise rows of roughness nodules, wherein one of the pair of rows extends along an edge of the flexible conductive surface and the other extends along an opposing edge of the flexible conductive surface; and a pair of parallel rows of roughness nodules substantially centered on the flexible conducive surface between the pair of edgewise rows, wherein the at least one channel comprises a plurality of channels, each channel is located in a corresponding separate region of the flexible conductive surface between respective rows of the roughness nodules.

11. The IHS of claim 8, wherein the plurality of roughness nodules includes:

first and second pairs of spaced-apart rows of roughness nodules, wherein the first pair of spaced-apart rows extends along an edge of the flexible conductive surface and the second pair extends along an opposing edge of the flexible conductive surface, wherein the at least one channel comprises a plurality of channels, each channel is located in a corresponding separate region of the flexible conductive surface between respective pairs of rows of roughness nodules.

12. The IHS of claim 8, wherein the plurality of roughness nodules includes:

a pair of edgewise rows of roughness nodules, wherein one of the pair of rows extends along an edge of the flexible conductive surface and the other extends along an opposing edge of the flexible conductive surface; and an off-centered row of roughness nodules between the pair of edgewise rows, wherein the at least one channel comprises a plurality of channels, each channel is located in a corresponding separate region of the flexible conductive surface between respective rows of the roughness nodules.

13. The IHS of claim 8, wherein the plurality of roughness nodules includes:

a plurality of closely aligned rows of roughness nodules substantially centered on the flexible conductive surface, wherein the at least one channel comprises a first channel located in a first region of the flexible conductive surface on a first side of the closely aligned rows of roughness nodules and a second channel in a second region of the flexible conductive surface on a second side of the closely aligned rows of roughness.

14. The IHS of claim 8, wherein the plurality of roughness nodules includes:

a first pair of closely aligned rows of roughness nodules extending along an edge of the flexible conductive surface; and a second pair of closely aligned rows of roughness nodules extending along an opposing edge of the flexible conductive surface, wherein the at least one channel comprises a single channel located in a region of the flexible conductive surface between the first and second pairs of closely aligned rows of roughness nodules.

15. A method of producing copper foil having a surface on which a plurality of roughness nodules are arranged according to a predetermined pattern, the method comprising:

providing a sheet formed from copper;

determining, based on a predetermined pattern of rows, distinct regions of a surface of the sheet on which to form and arrange a plurality of roughness nodules; and forming roughness nodules on each distinct region of the surface as determined in accordance with the predetermined pattern, wherein at least one channel providing a conductive path located between a pair of rows of roughness nodules formed on the surface of the sheet.

16. The method of claim 15, wherein the predetermined pattern yields:

a pair of edgewise rows of roughness nodules, wherein one of the pair of rows extends along an edge of the sheet and the other extends along an opposing edge of the sheet; and a pair of parallel rows of roughness nodules substantially centered on the surface of the sheet between the pair of edgewise rows, wherein the at least one channel comprises a plurality of channels, each channel is located in a corresponding separate region of the surface of the sheet between respective rows of the roughness nodules.

17. The method of claim 15, wherein the predetermined pattern yields:

first and second pairs of spaced-apart rows of roughness nodules, wherein the first pair of spaced-apart rows extends along an edge of the sheet and the second pair extends along an opposing edge of the sheet, wherein the at least one channel comprises a plurality of channels, each channel is located in a corresponding separate region of the surface of the sheet between respective pairs of rows of roughness nodules.

18. The method of claim 15, wherein the predetermined pattern yields:

a pair of edgewise rows of roughness nodules, wherein one of the pair of rows extends along an edge of the sheet and the other extends along an opposing edge of the sheet; and an off-centered row of roughness nodules on the surface of the sheet between the pair of edgewise rows, wherein the at least one channel comprises a pair of channels, each channel is located in a corresponding separate region on the surface of the sheet between respective rows of the roughness nodules.

19. The method of claim 15, wherein the predetermined pattern yields:

a plurality of closely aligned rows of roughness nodules substantially centered on the surface of the sheet, wherein the at least one channel comprises a first channel located in a first region of the surface on a first side of the closely aligned rows of roughness nodules and a second channel in a second region of the surface on a second side of the closely aligned rows of roughness.

20. The method of claim 15, wherein the predetermined pattern yields:

a first pair of closely aligned rows of roughness nodules extending along an edge of the sheet; and a second pair of closely aligned rows of roughness nodules extending along an opposing side of the sheet, wherein the at least one channel comprises a single channel located in a region of the surface of the sheet between the first and second pairs of closely aligned rows of roughness nodules.

* * * * *